United States Patent [19]
Wong et al.

[11] Patent Number: 5,680,341
[45] Date of Patent: Oct. 21, 1997

[54] PIPELINED RECORD AND PLAYBACK FOR ANALOG NON-VOLATILE MEMORY

[75] Inventors: Sau C. Wong, Hillsborough; Hock C. So, Redwood City, both of Calif.

[73] Assignee: inVoice Technology, Sunnyvale, Calif.

[21] Appl. No.: 587,310

[22] Filed: Jan. 16, 1996

[51] Int. Cl.$^6$ .................................................. G11C 13/00
[52] U.S. Cl. ........................... 365/45; 365/73; 365/77
[58] Field of Search .................................. 365/45, 73, 77, 365/189.01, 230.03

[56] References Cited

U.S. PATENT DOCUMENTS

| | | | |
|---|---|---|---|
| 4,054,864 | 10/1977 | Audaire et al. | 340/173 |
| 4,057,788 | 11/1977 | Sage | 365/174 |
| 4,181,980 | 1/1980 | McCoy | 365/45 |
| 4,200,841 | 4/1980 | Nagata et al. | 455/169 |
| 4,318,188 | 3/1982 | Hoffmann | 365/45 |
| 4,627,027 | 12/1986 | Rai et al. | 365/45 |
| 4,809,223 | 2/1989 | Brown | 365/45 |
| 4,852,063 | 7/1989 | McNutt | 365/185 |
| 4,890,259 | 12/1989 | Simko | 365/45 |
| 4,935,702 | 6/1990 | Mead et al. | 330/9 |
| 4,989,179 | 1/1991 | Simko | 365/45 |
| 5,028,810 | 7/1991 | Castro et al. | 307/201 |
| 5,055,897 | 10/1991 | Canepa et al. | 357/23.5 |
| 5,126,967 | 6/1992 | Simko | 365/45 |
| 5,163,021 | 11/1992 | Mehrotra et al. | 365/185 |
| 5,164,915 | 11/1992 | Blyth | 365/45 |
| 5,168,465 | 12/1992 | Harari | 257/320 |
| 5,172,338 | 12/1992 | Mehrotra et al. | 365/185 |
| 5,218,569 | 6/1993 | Banks | 365/189.01 |
| 5,220,531 | 6/1993 | Blyth et al. | 365/189.07 |
| 5,239,500 | 8/1993 | Oguey | 365/45 |
| 5,241,494 | 8/1993 | Blyth et al. | 365/45 |
| 5,243,239 | 9/1993 | Khan et al. | 307/521 |
| 5,262,984 | 11/1993 | Noguchi et al. | 365/185 |
| 5,272,669 | 12/1993 | Samachisa et al. | 365/185 |
| 5,294,819 | 3/1994 | Simko | 257/314 |
| 5,339,270 | 8/1994 | Jiang | 365/185 |
| 5,394,362 | 2/1995 | Banks | 365/189.01 |
| 5,430,670 | 7/1995 | Rosenthal | 365/45 |

OTHER PUBLICATIONS

Press Release: Intel Announces Multilevel Cell Flash Technology. Intel Corporation, 1994, 3 pages.

"Solutions OEM," A Publication of Intel Corporation, vol. 2, No. 2, (Autumn) Sep., 1994, pp. 1–8.

Ajika et al., "A 5 Volt Only 16M BIT Flash EEPROM Cell with a Simple Stacked Gate Structure", (Reprinted from IEDM Tech. Dig., 1990, pp. 115–118), LSI R&D Lab., Paper 5.11, pp. 209–212.

Chen et al, "Subbreakdown Drain Leakage Current in MOSFET", IEEE, 1987, pp. 515–517.

Dov Frohman–Bentochkowsky, "A Fully Decoded 2048–Bit Electrically Programmable FAMOS Read–Only Memory" (reprinted from IEEE J. Solid–State Circuits, vol. SC–6, #5, Oct. 1971pp. 301–306) pp. 63–68.

Lenzinger et al., "Fowler–Nordheim Tunneling into Thermally Grown $SiO_2$", Journal of Applied Physics, vol. 40, No. 1, Jan. 1969, pp. 278–283.

(List continued on next page.)

*Primary Examiner*—Terrell W. Fears
*Attorney, Agent, or Firm*—Skjerven, Morrill, MacPherson, Franklin & Friel; Alan H. MacPherson; David T. Millers

[57] ABSTRACT

A non-volatile analog memory contains multiple recording pipelines for sampling and storing values representing an analog signal and/or multiple playback pipelines for playing a recorded signal. Each recording pipeline includes a sample-and-hold circuit and a write circuit coupled to a memory array associated with that pipeline and is capable of write operations that overlap write operations of other recording pipelines. Each playback pipeline includes a read circuit and a sample-and-hold circuit coupled to an associated memory array and is capable of read operations that overlap read operations of other playback pipelines. The pipelines operate sequentially during recording or playback, and the number of pipelines is selected according to a desired sampling frequency. One embodiment provides a modular integrated circuit architecture which allows a user selected number of ICs to be connected together to handle a desired sampling frequency.

30 Claims, 8 Drawing Sheets

OTHER PUBLICATIONS

Haddad et al., "Degradations Due to Hole Trapping in Flash Memory Cells", 1989, IEEE Electron Device Lett., vol. 10, No. 3, pp. 117–119.

Hoe et al., "Cell and Circuit Design for Single–Poly EPROM", 1989, IEEE Journal of Solid–State Circuits, vol. 24, No. 4, pp. 1153–1157.

Johnson et al., "A 16Kb Electrically Erasable Nonvolatile Memory", IEEE ISSCC, Dig. Tech. pap. 1980, pp. 125–127.

Kamiya et al, "EPROM Cell with High Gate Injection Efficiency", IEDM Tech. Dig. 1982 (reprint) pp. 741–744.

Kazerounian et al, "A 5 Volt High Density Poly–Poly Erase Flash EPROM Cell", IEDM Tech. Dig., 1988 (reprint) pp. 202–205.

Kynett et al, "An In–System Reprogrammable 32Kx8 CMOS Flash Memory", IEEE J. Solid–State Circuits, vol. 23, No. 5. Oct. 1988 (reprint), pp. 170–175.

Naruke et al, "A New Flash–Erase EEPROM Cell With a Sidewall Select–Gate On Its Source Side", IEDM Tech. Dig., 1989 (reprint) pp. 183–186.

Perlegos et al, "A 64K EPROM Using Scaled MOS Technology", IEEE ISSCC Dig. Tech. Pap., 1980 (reprint) pp. 69–71.

Wu et al, "A Novel High–Speed, 5–Volt Programming EPROM Structure with Source–Side Injection", IEDM Tech. Dig., 1986 (reprint) pp. 108–111.

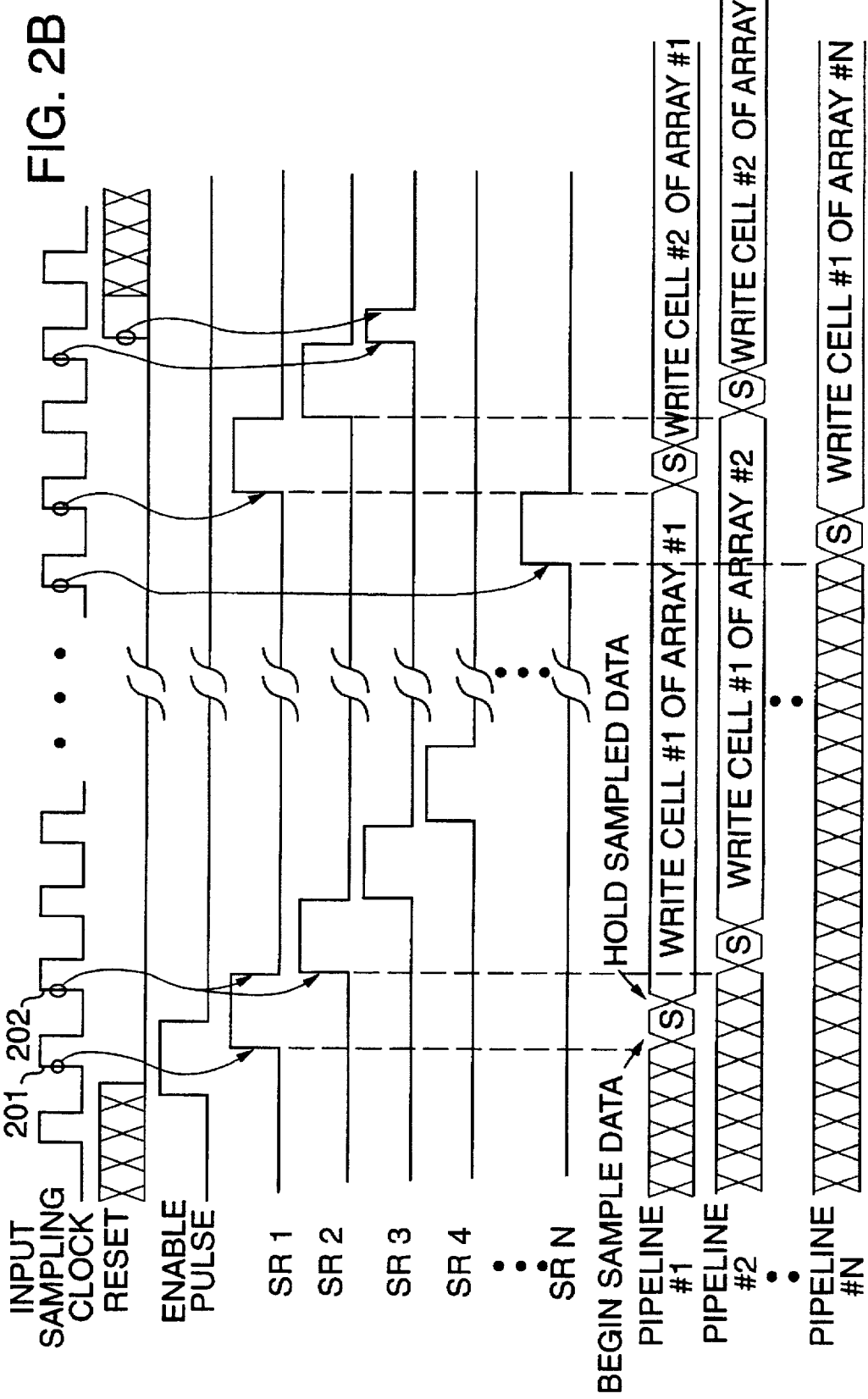

PIPELINED RECORD AND PLAYBACK FOR ANALOG NON-VOLATILE MEMORY

BACKGROUND OF THE INVENTION

1. Field of the Invention

This invention relates to non-volatile, integrated circuit memories capable of storing analog values and to interfaces for input and output of analog signals in non-volatile memories.

2. Description of Related Art

A continuous analog signal such as a sound signal from a microphone can be recorded using a non-volatile semiconductor memory for analog data storage. For recording, the continuous signal is sampled at a rate given by a sampling frequency to generate a series of discrete samples which are written to the non-volatile memory, one sample per memory cell. The sampling frequency typically depends on the desired fidelity of the recording. For voice recording, a sampling frequency of between 5 and 10 kHz typically provides sufficient clarity. However, high fidelity recordings often require sampling frequencies over 20 kHz.

A known sound recording system contains an analog EEPROM (electrically erasable and programmable read-only memory) which relies on Fowler-Nordheim tunneling for writing samples to memory cells. Such EEPROMs have typical write times on the order of 10 ms which is much longer than the 100 µs allowed between samples at a sampling frequency of 10 kHz. Accordingly, one system using EEPROMs performs parallel writes of on the order of 100 samples and contains two banks of sample-and-hold circuits to collect and hold the samples for the parallel write operations. During recording, the sample-and-hold circuits in a first bank sequentially sample a sound signal while previous samples from a second bank are written in parallel to the analog memory. After writing the previous samples from the second bank and filling the first bank with new samples, the roles of the first and second banks are reversed; and the sample-and-hold circuits in the second bank sequentially sample the sound signal while samples held in the first bank are written in parallel to the memory.

Using dual banks of sample-and-hold circuits has disadvantages. One disadvantage is the large die size required to fabricate integrated circuits containing the banks of sample-and-hold circuits and write circuits for parallel writing of a large number of analog samples. For example, a sampling frequency of 10 kHz typically requires on the order of 200 sample-and-hold circuits (100 per bank) and requires write circuitry sufficient for parallel writing of 100 analog values. Additionally, logic and timing circuits for controlling sampling at a sampling frequency and parallel writing according to a write time are relatively large and complex.

Another disadvantage of banks of sample-and-hold circuits is variations in the times between sampling and writing. For example, the first sample in a bank is held while all other samples are taken which allows a capacitor in the sample-and-hold circuit holding the first sample to leak and change the sample before it is written. Different sample-and-hold circuits in a bank hold samples for different periods so that the leakage and therefore the changes in sample values vary across the banks.

Use of banks of sample-and-hold circuits also limits the maximum and minimum sampling frequencies of the system. Low sampling frequencies cause some samples to be held a long time while a bank fills with new samples. This limits the minimum sampling frequency because samples held too long become unreliable. The maximum sampling frequency is the number of sample-and-hold circuits per bank divided by the write time. Accordingly, ICs using dual banks have an optimum sampling frequency and are difficult to use in applications requiring a sampling frequency that differs greatly from the optimum sampling frequency.

SUMMARY OF THE INVENTION

In accordance with an aspect of the invention, a recording system has a set of independent recording pipelines which are capable of overlapping write operations. Each recording pipeline typically includes a sample-and-hold circuit and an analog write circuit for writing an analog sample to a memory array that corresponds to the pipeline. The pipelines operate in sequential order beginning with a first pipeline and proceeding through the sequence of pipelines at a rate determined by a sampling frequency. Each pipeline samples an input analog signal and writes the sample obtained to an associated memory array. Writing of a sample begins immediately after sampling in each pipeline so that the disadvantages of holding a sample for a long time are avoided. Additionally, the sample-and-hold circuits all have the same holding time to reduce problems associated with charge leakage and variable changes in samples.

The number of pipelines in the system is selected according to the desired sampling frequency. In particular, beginning with the first pipeline and proceeding to a last pipeline, the pipelines sequentially begin write operations and continue their write operations as other write operations are initiated. The number of pipelines is such that by the time the last pipeline in the sequence has begun a write operation the first pipeline has completed its write operation and is ready to begin another. Accordingly, recording of an analog signal proceeds using the recording pipelines in a cyclic fashion.

In accordance with another aspect of the invention, an integrated analog memory circuit has a modular architecture including one or more recording pipelines and a timing circuit adapted for connection to another similar analog memory circuit. For example, in one embodiment, the timing circuit includes one or more shift registers through which a pulse can propagate and sequentially trigger operations of the pipelines. The analog memory circuits can be chained together to provide enough pipelines to accommodate any desired sampling frequency.

Often, read operations for non-volatile memories are sufficiently fast that playback operations read samples from the non-volatile memories at the desired sampling frequency without the need of overlapping read operations. However, an output interface can be provided with a set of playback pipelines capable of overlapped read operations. The playback pipelines operate sequentially, and each pipeline can begin reading before the other pipelines complete their read operations. This allows a higher sampling frequency for playback than a system without overlapped read operations could achieve. The pipelined playback systems can provide a "fast forward" capability using a sampling frequency higher than the sampling frequency used during recording or can accommodate slow read processes.

BRIEF DESCRIPTION OF THE DRAWINGS

FIGS. 2B and 2D show timing diagrams for the input and output interfaces of FIGS. 2A and 2C.

Use of the same reference symbols in different figures indicates similar or identical items.

DETAILED DESCRIPTION OF THE PREFERRED EMBODIMENTS

Figure 1:
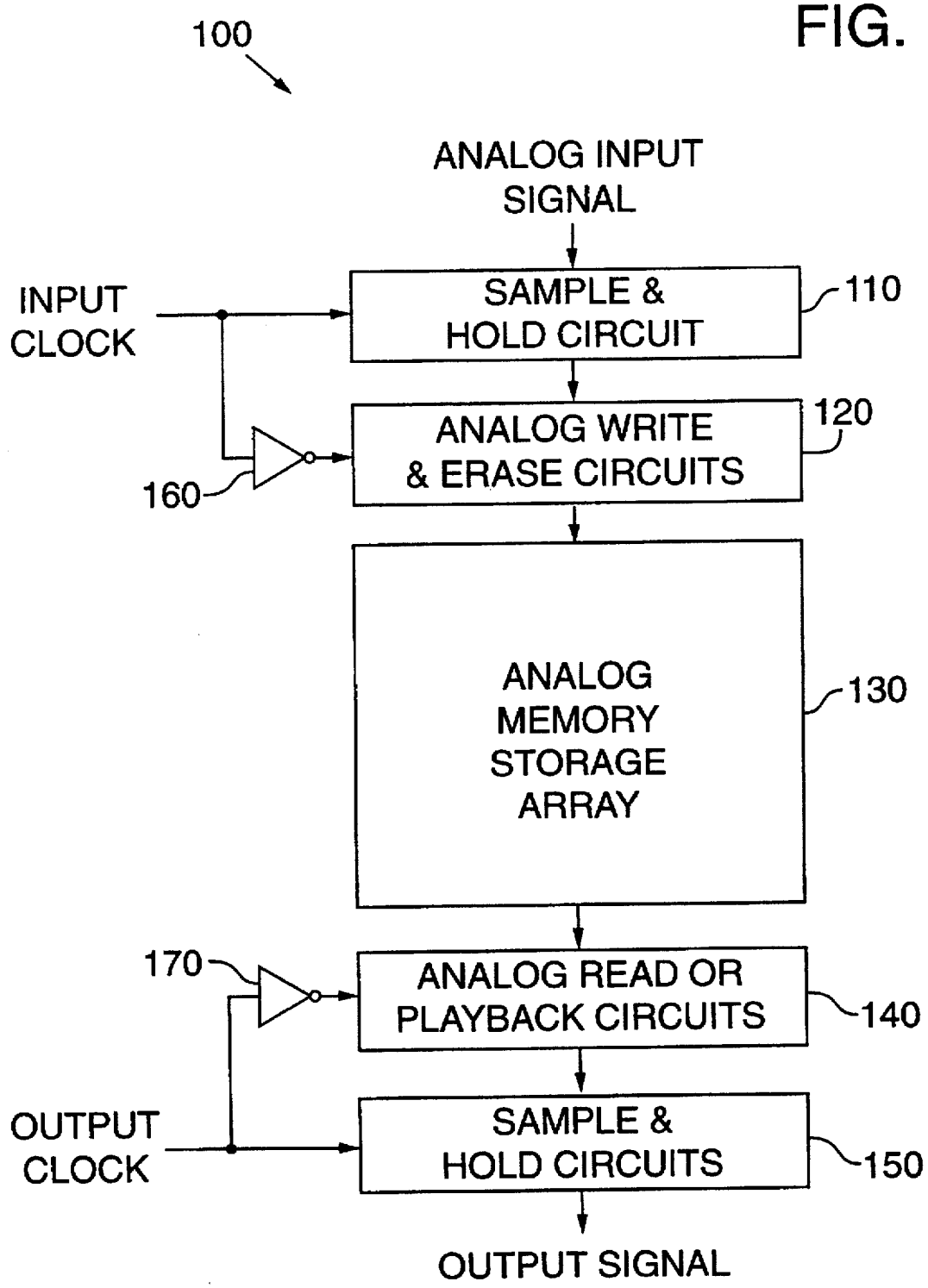
FIG. 1 shows a block diagram of a memory module usable in a pipelined record and playback system in accordance with an embodiment of the invention.

In accordance with one embodiment of the invention, a non-volatile memory with a modular architecture allows creation of multiple pipelines in input and/or output interfaces for recording and/or playing back analog signals. FIG. 1 shows an analog memory 100 which is usable alone or with other similar analog memories to form a record and playback system. Analog memory device 100 has an input interface which includes a sample-and-hold circuit 110 and an analog write circuit 120 connected to an analog memory array 130.

During recording of an analog input signal, an edge of an input clock signal triggers sample-and-hold circuit 110 which then samples the analog input signal and applies the resulting sample to analog write circuit 120. At a following edge of the input clock or after a predetermined sampling time, analog write circuit 120 begins writing the sampled value to a selected memory cell in analog memory array 130. An address generator (not shown) can increment or otherwise select a new address each cycle of the input clock to write samples in a desired order in analog memory array 130.

Analog memory array 130 can be any type of non-volatile memory suited for storing analog data. For example, analog memory array 130 can be an EEPROM or a Flash EEPROM which uses Fowler-Nordheim tunneling or an EPROM or a Flash EPROM which uses channel hot electron injection to raise the threshold voltage of a selected memory cell. EPROM or Flash EPROM are preferred because they provide shorter write times and allow higher sampling frequencies. Analog write circuit 120 contains the circuitry necessary to generate the control gate, drain, and source voltages for setting the threshold voltage of a selected memory cell to a level representing the sample from sample-and-hold circuit 110. The exact nature of analog write circuit 120 depends upon the structure of analog memory array 130, but is otherwise not critical to the invention. U.S. patent application Ser. No. 08/333,381, entitled "High Resolution Analog Storage EPROM and Flash EPROM," describes exemplary embodiments of write circuits for analog EPROM and is incorporated by reference herein in its entirety.

The period of the input clock must be greater than the time required for analog write circuit 120 to write an analog value. Thus, the maximum frequency of the input clock signal is slightly less than one over the required write time. In a system where sample-and-hold circuit 110 and analog write circuit 120 provide the only write path for samples, the maximum frequency of the input clock signal is the maximum sampling frequency. If analog memory array 130 is an EPROM or Flash EPROM array having a write time of 100 μs, the maximum sampling frequencies is about 10 kHz which is more than sufficient for "telephone-quality" voice recording. Using memory 100 as a standalone recording system has the advantage of requiring a small circuit area with very little overhead circuitry. Timing and control circuit logic is simple, and only one sample-and-hold circuit 110 is required for recording. Additionally, the effects of circuit variations and charge leakage are reduced because one sample-and-hold circuit is used for all samples and writing begins immediately after sampling.

For EEPROM with a 10-ms write time, the maximum sampling frequency is about 100 Hz which is too low for recording voice signals. When the maximum frequency of the input clock signal is below the desired sampling frequency, memory 100 can be combined with (N-1) similar memories which provide a set of N pipelines for storing the analog input signal. In such embodiments the maximum sampling frequency is N times the maximum frequency of input clock 100. According, any desired sampling frequency can be used if a sufficient number of analog memories (pipelines) are combined. For example, if each pipeline can record at a frequency of about 10 kHz, five or more pipelines can be used in a system to record a CD-quality sound signal with a sampling frequency of about 44 kHz or higher. The pipelined system requires about half the number of sample-and-hold circuits used in systems having dual banks because the number of sample-and-hold circuits in the pipelined system is equal to the write time divided by the sampling period but the dual banks systems each bank has that number of sample-and-hold circuits.

The output interface of memory 100 includes an analog read circuit 140 and a second sample-and-hold circuit 150 which samples a value from analog read circuit 140 to generate an output signal. During playback of a recorded signal, an edge of an output clock signal triggers analog read circuit 140 which then reads a selected memory cell. The address of the selected memory cell changes each cycle of the output clock, in the same manner as the address used when recording the signal. After the selected memory cell is read, sample-and-hold circuit 150 sets the output signal to indicate the stored sample.

The time required to read analog memory array 130 restricts the maximum sampling frequency for playback. However, read times are usually shorter than write times for most current non-volatile memories, so that the maximum sampling frequency for playback is usually higher than the maximum sampling frequency for recording. This allows fast forwarding where a recorded signal is played at a rate higher than the recording rate. Further, the output interface of memory 100 can be connected to the output interfaces of other similar memories to provide a higher maximum output sampling frequency. This accommodates relatively slow reading techniques such as slowly ramping a control gate voltage and sampling the control gate voltage when a memory cell begins to conduct. Even with a relatively slow read process, a sufficient number of playback pipelines in a playback system can provide CD-quality sound having a sampling frequency of about 44 kHz or higher.

Figure 2A:
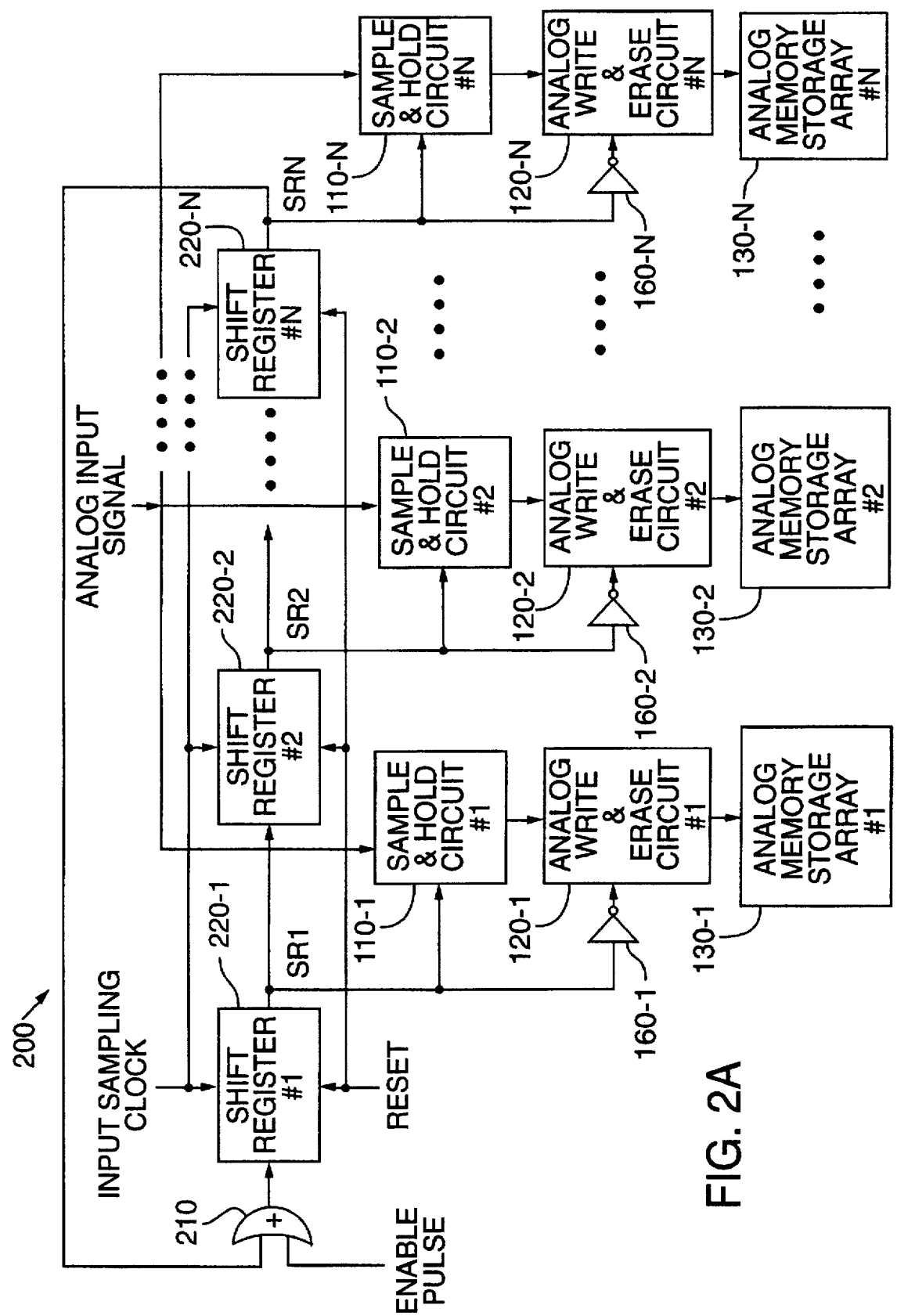
FIGS. 2A and 2C show block diagrams of an input interface and an output interface, respectively, in accordance with the invention.

FIG. 2A shows a block diagram of recording system 200 having multiple recording pipelines in accordance with an embodiment of the invention. Recording system 200 includes sample-and-hold circuits 110-1 to 110-N and analog write circuits 120-1 to 120-N connected to memory arrays 130-1 to 130-N to form N recording pipelines. Elements of each pipeline operate in the same manner as elements 110, 120, and 130 as described above in regard to FIG. 1.

FIG. 2B shows timing diagrams for storing an analog signal in recording system 200. Initially, signal RESET is asserted, shift registers 220-1 to 220-N are reset, and memory arrays 130-1 to 130-N are prepared for recording.

For most non-volatile memories such as EEPROM, EPROM, or Flash memory such as Flash EEPROM or Flash EPROM, preparation includes erasing storage locations and typically takes much longer (typically 100 ms) than the write time. An erase operation for any of memory arrays 130-1 to 130-N can erase the entire memory array or a section of the memory array selected for the recorded signal, and erases of arrays 130-1 to 130-N can be performed in parallel, sequential, or pipeline fashion.

To begin recording, the analog input signal is connected to each sample-and-hold circuits 110-1 to 110-N, and an enable pulse is high when signal RESET is deasserted. An OR gate 210 provides the enable pulse as the input signal to shift register 220-1. Output signal SR1 from shift register 220-1 goes high at a rising edge 201 of the input sampling clock, which occurs while the enable signal is high. In response to the next rising edge 202 of the input sampling clock, shift register 220-1 deasserts signal SR1, and shift register 220-2 asserts signal SR2 because signal SR1 was high at rising edge 202. A pulse thus propagates through shift registers 220-1 to 220-N, and signals SR1 to SRN sequentially trigger sample-and-hold circuits 110-1 to 110-N which begin sampling the analog input signal for recording. The last shift register 220-N is coupled to an input terminal of OR gate 210 so that signal SR1 is asserted again after signal SRN. Recording continues cyclically using sample-and-hold circuits 110-1 to 110-N until signal RESET stops the pulse and the recording process.

Sample-and-hold circuits 110-1 to 110-N hold the sample in response to the associated one of signals SR1 to SRN being deasserted or alternatively after a fixed delay from beginning to sample data, and each of analog write circuits 120-1 to 120-N when triggered begins to write the held sample. In the embodiment of FIG. 2A, a rising edge of a pulse in any one of signals SR1 to SRN triggers an associated one of sample-and-hold circuits 110-1 to 110-N, and a falling edge of the pulse (a rising edge of a signal from an associated one of inverters 160-1 to 160-N) starts the associated one of write circuits 120-1 to 120-N writing. Alternatively, inverters 160-1 to 160-N could be replaced by circuits which delay the start of writing until just after sample-and-hold circuits 110-1 to 110-N hold data. The delays between sampling and writing a sample are constant and relatively small for all pipelines. Accordingly, charge leakage in sample-and-hold circuits 110-1 to 110-2 is small and approximately equal for all pipelines.

Write circuits 120-1 to 120-N begins write operations at different times and overlaps write operations at different stages of completion. To permit this, memory arrays 130-1 to 130-N are separated so that source, drain, and control gate voltages generated by one of write circuits 120-1 to 120-N do not interfere with other write circuits. The available write time for a write circuit extends from when a sample is held until the associated sample-and-hold circuit begins sampling again.

In accordance with one embodiment of the invention, recording system 200 is fabricated as a single integrated circuit. Alternatively, system 200 can be fabricated as two or more integrated circuits each containing one or more recording pipeline. For example, N separate integrated circuits, such as circuit 100 of FIG. 1 can be connected together using discrete shift registers and logic. Alternatively, N separate circuits, each containing a recording pipeline (an analog write circuit 120 and a sample-and-hold circuit 110), a memory array 130, and a shift register 220, can be coupled together to form system 200 without the need for discrete logic. In still another alternative, integrated circuits each containing two or more recording pipelines can be coupled together to form recording system 200.

In recording system 200, any desired sampling frequency can be accommodated. Charge leakage in sample-and-hold circuits 110-1 to 110-N does not restrict use of low sampling frequencies because the delay between sampling and writing is independent of the frequency and sample-and-hold circuits 110-1 to 110-N are not required to hold samples for long periods of time even at very low sampling frequencies. High sampling frequencies are accommodated by selecting a suitable number of recording pipelines. The number of pipelines should be greater than or equal to the ratio of the write time and the period of the sampling clock signal. Although particular integrated circuits in accordance with the invention have fixed maximum frequencies which depend on the number of pipelines and the write time of memory arrays in the integrated circuits, such integrated circuits can be connected together to handle higher sampling frequencies.

Figure 2C:
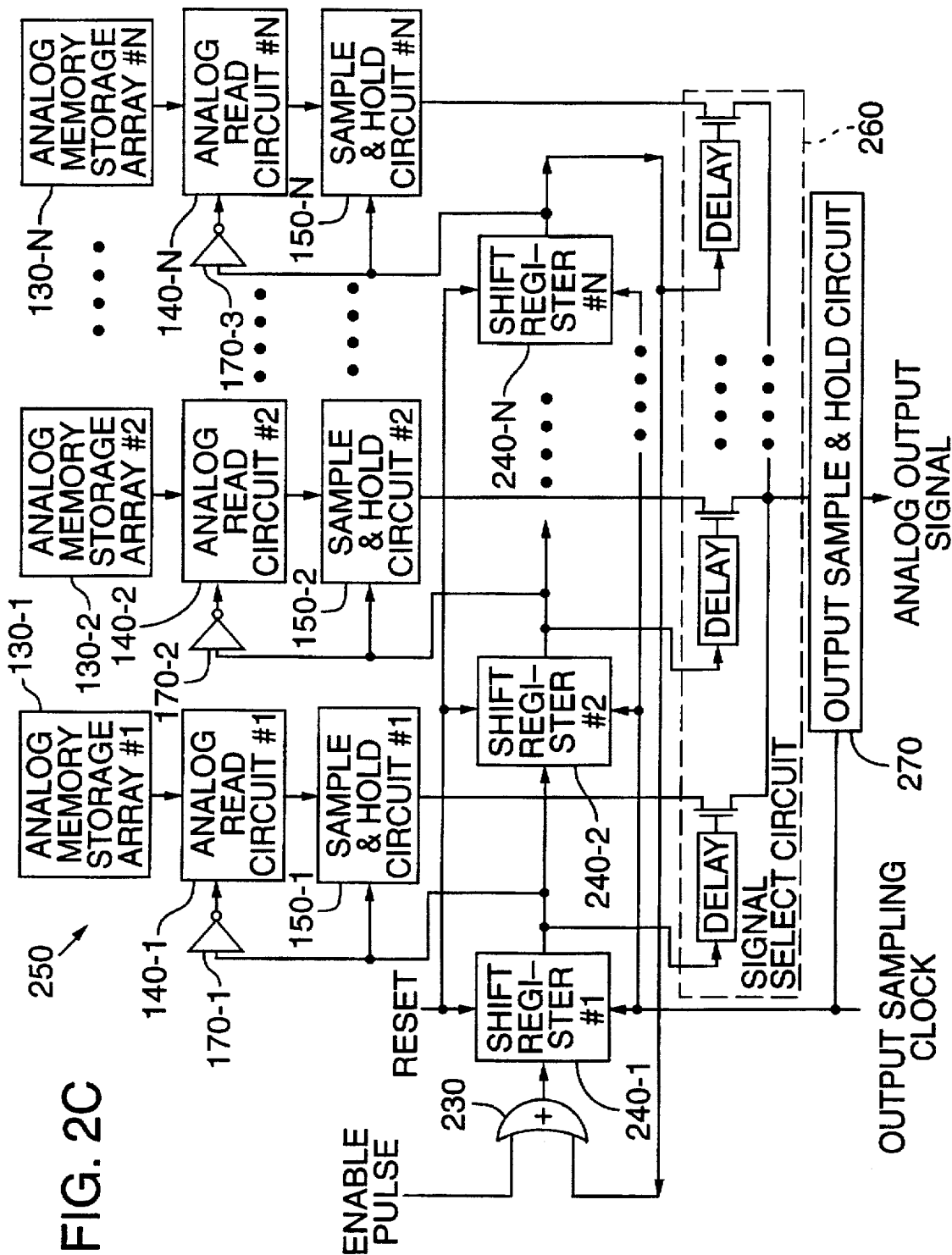

Typically, reading of non-volatile analog memory is faster than writing, and sequential reading of memory cells with no overlap of the read operations is sufficient to read (or playback) an analog signal. Accordingly, recording system 200 can be used with a conventional playback system including a single analog read circuit which sequentially reads entries from memory arrays 130-1 to 130-N. However, a pipelined playback system can provide for higher sampling frequencies or to accommodate slower (and possibly more accurate) read processes. FIG. 2C shows an embodiment of a playback system 250 having N playback pipelines for playing a signal stored in memory arrays 130-1 to 130-N. Playback system 250 may be used with or without a pipelined recording system such as recording system 200.

In system 250, the playback pipelines contain analog read circuits 140-1 to 140-N and sample-and-hold circuits 150-1 to 150-N which operate as described for analog read circuit 140 and sample-and-hold circuit 150 of FIG. 1. Playback system 250 also has a timing circuit including a series of shift registers 240-1 to 240-N which control initiation of read operations and has an output signal selection circuit 260 and a master sample-and-hold circuit 270.

Figure 2D:
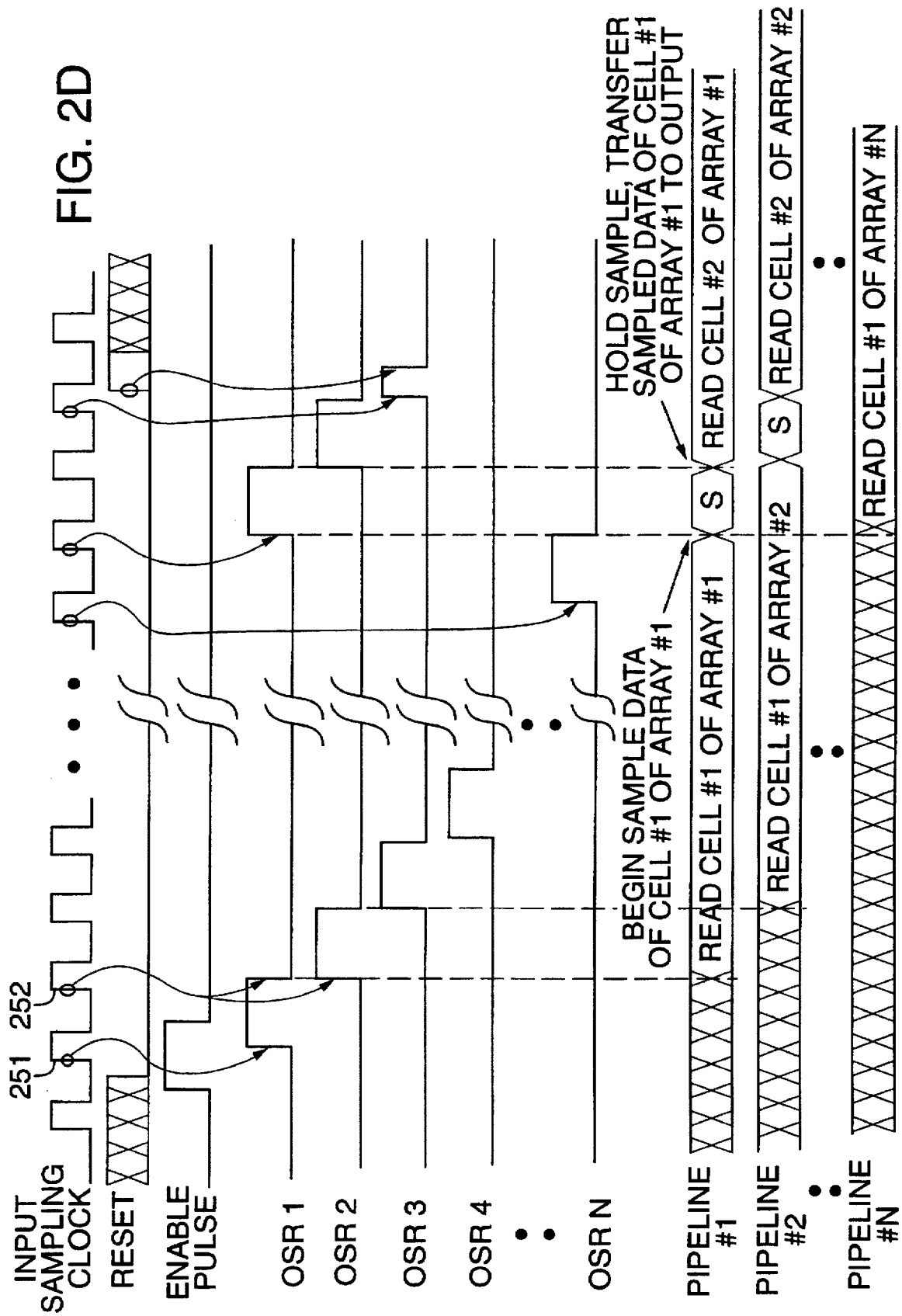

FIG. 2D shows timing diagrams for playing a signal stored in analog memory arrays 130-1 to 130-N. A signal RESET is asserted to reset shift registers 240-1 to 240-N. To begin playback, an enable pulse is asserted through an OR gate 230 to shift register 240-1 and is held for one rising edge 251 of the output sampling clock. The output sampling clock may have the same frequency as the input sampling clock or may have different frequency, for example, a higher frequency for fast forward playback. In response to rising edge 251, signal OSR1 is asserted. Signal OSR1 is deasserted, and signal OSR2 is asserted at the next rising edge 252. In this fashion, a pulse propagates through shift registers 240-1 to 240-N at a rate that depends on an output sampling clock signal. The last shift register 240-N in the series asserts the pulse back to the first shift register 240-1 via OR gate 230 so that the playback process continues until shift registers 240-1 to 240-N are reset.

A falling edge in one of signals OSR1 to OSRN triggers an associated one of analog read circuits 140-1 to 140-N to begin reading a selected memory cell in an associated memory array 130-1 to 130-N. When the read process is complete, the associated sample-and-hold circuit 150-1 to 150-N samples the value read. In playback system 250, each of inverters 170-1 to 170-N triggers an associated one of read circuits 150-1 to 150-N to begin reading at falling edge of an associated one of signals OSR1 to OSRN. The following rising edge of that one of signals OSR1 to OSRN causes an associated one of sample-and-hold circuits 150-1 to 150-N to begin sampling the value read. Sampling must be complete by or before the next falling edge at which read circuit begins reading a new value. Accordingly, the maximum allowable read time is the time between pulses of signal OSR1.

A signal select circuit 260 selects which of sample-and-hold circuits 150-1 to 150-N provides a data signal to master sample-and-hold circuit 270. Master sample-and-hold circuit 270 samples a different selected data signal each clock cycle of the output sampling clock.

Figure 3A:
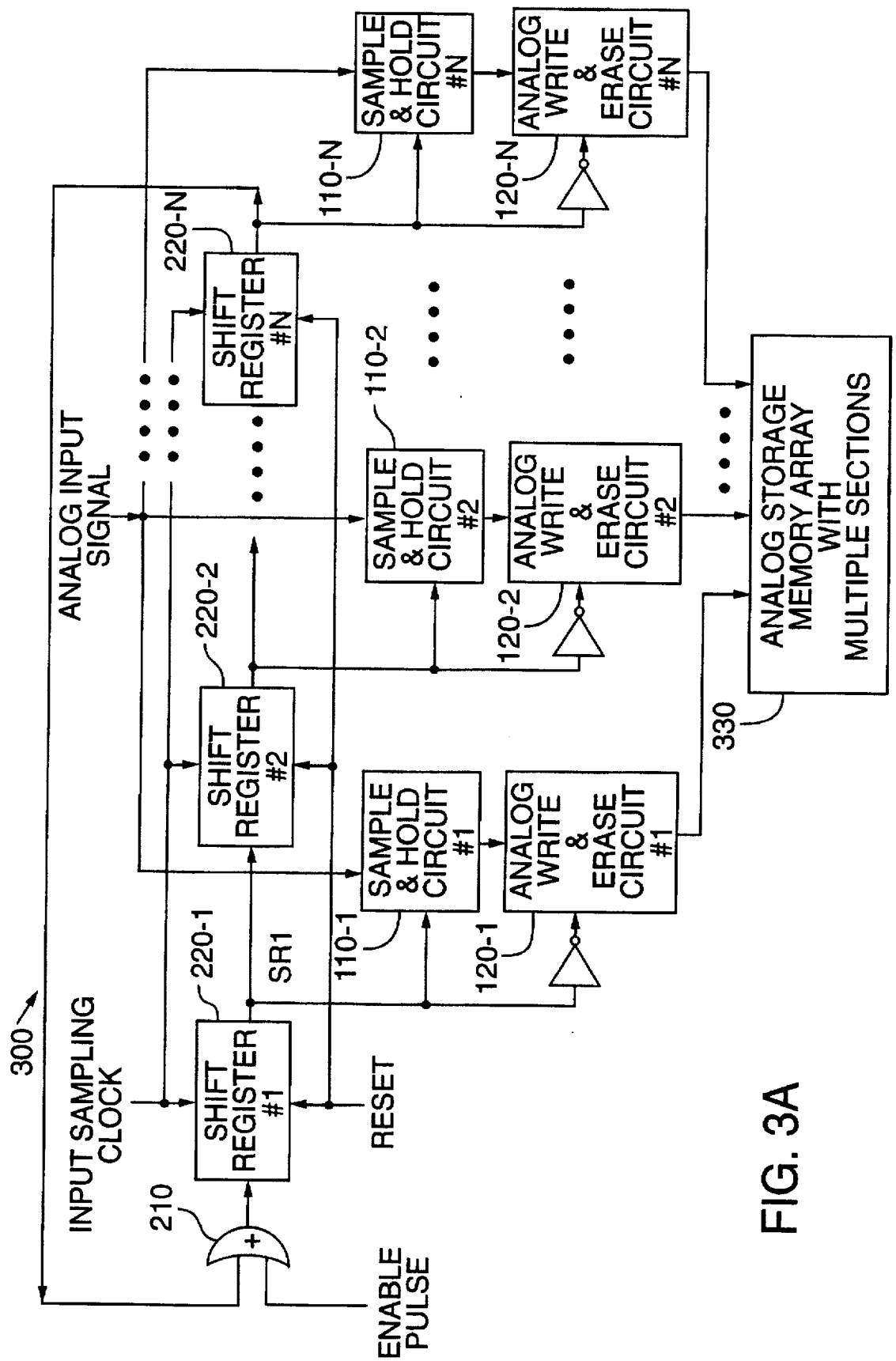
FIGS. 3A and 3B show block diagrams of an input interface and an output interface, respectively, in accordance with the invention.
Figure 3B:
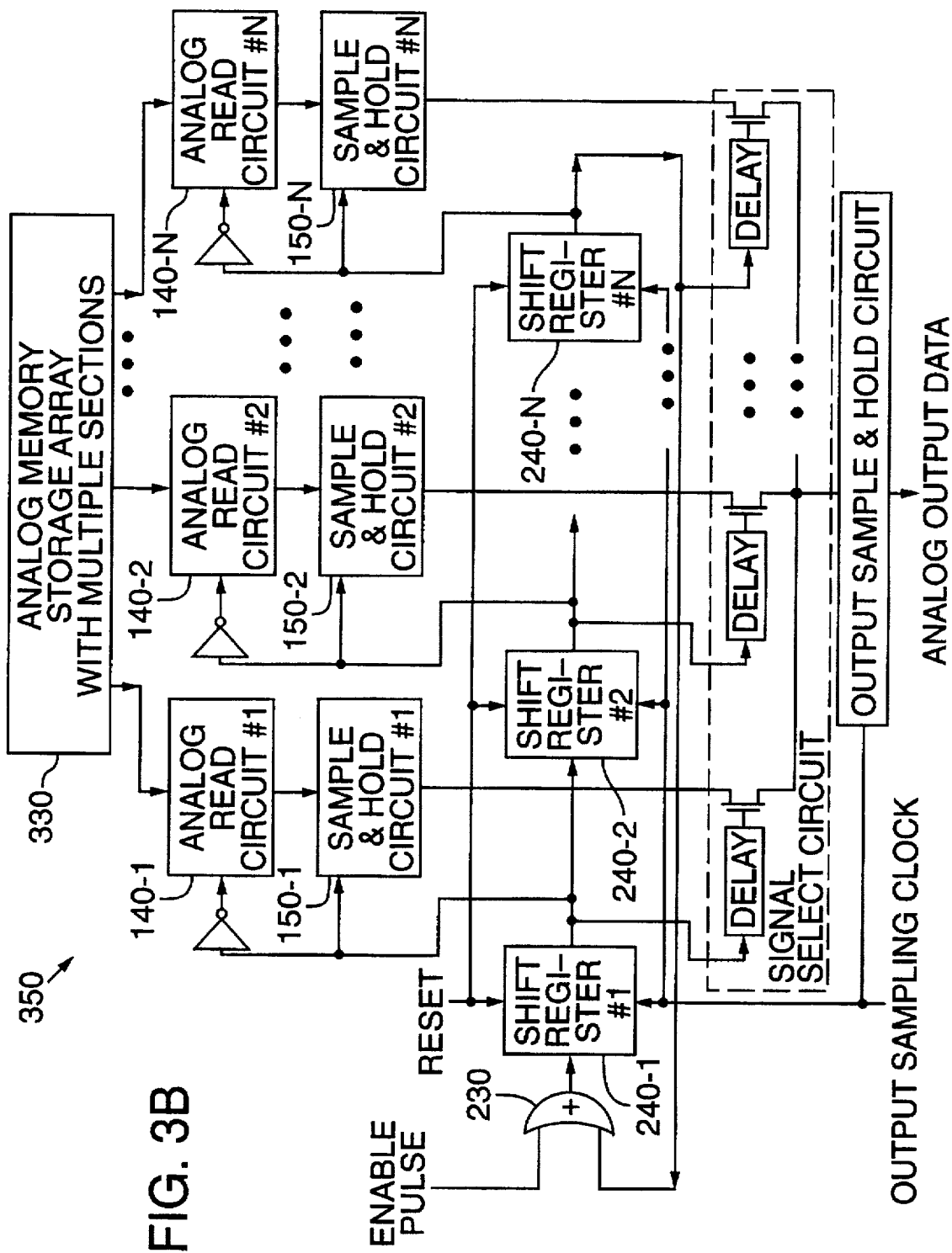

FIGS. 3A and 3B respectively show a recording system 300 and a playback system 350. Recording system 300 and playback system 350 differ from recording system 200 and playback system 250 of FIGS. 2A and 2C in that systems 300 and 350 include a segmented memory array 330 formed in a single integrated circuit. Array 330 is segmented so that pipelined read and/or write operations do not interfere with each other. In recording system 300, each analog write circuit has an associated segment of memory array 330, and neither bit lines nor word lines are continuous across the boundary of the segments. In particular, word lines are discontinuous to prevent a conflict from occurring when two of analog write circuits 120-1 to 120-N are simultaneously writing to selected memory cells in different rows of memory array 330. Similar segmentation of word lines is required for playback system 350 so that only the selected cells are read even when selected cells are in different rows.

Figure 4:
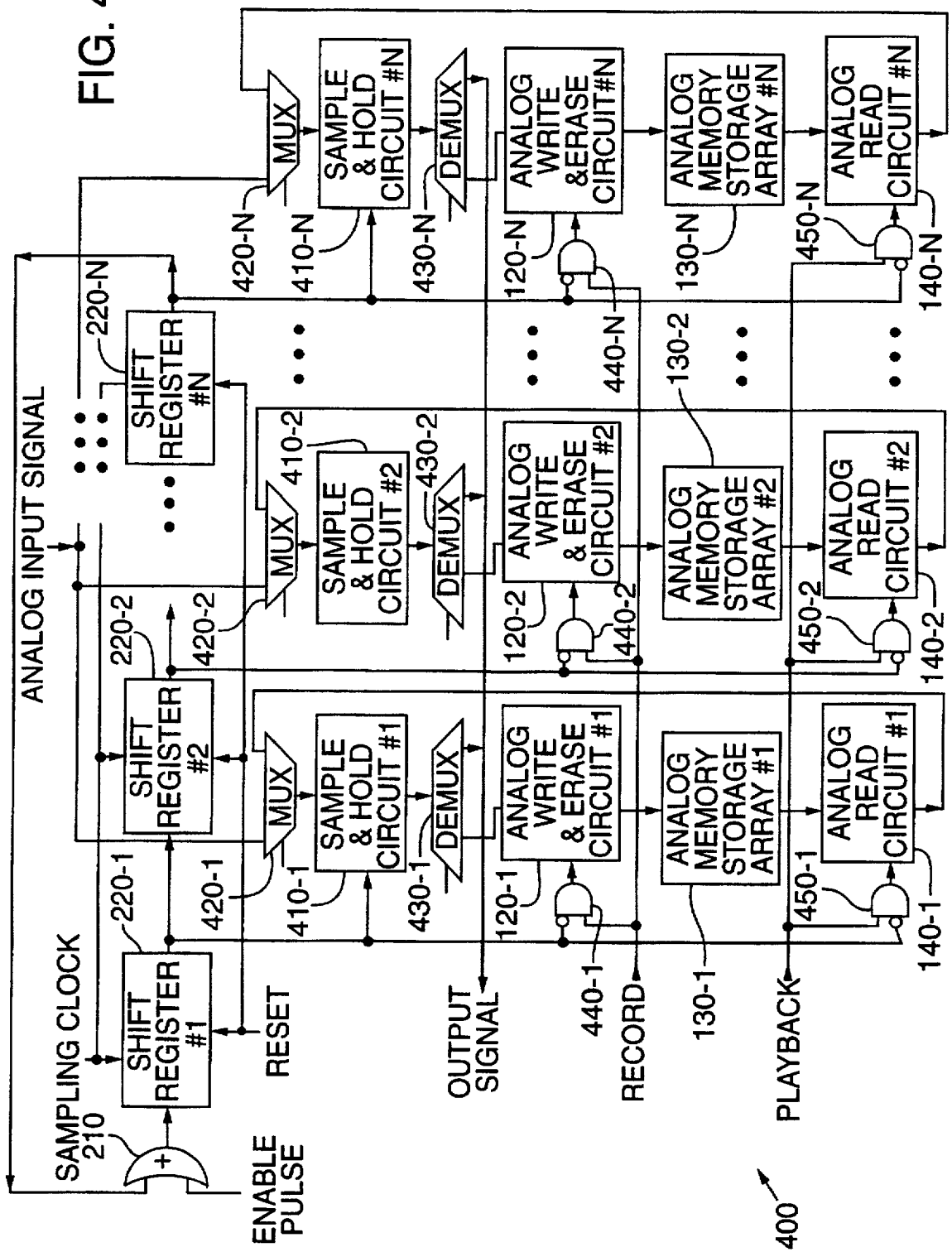
FIG. 4 shows a block diagram of a pipelined record and playback system in accordance with the invention.

FIG. 4 shows an embodiment of the invention having a single set of sample-and-hold circuits 410-1 to 410-N for both recording pipelines and playback pipelines. During recording, a control signal RECORD is asserted; and a control signal PLAYBACK is deasserted. Multiplexers 420-1 to 420-N connect the analog input signal to sample-and-hold circuits 410-1 to 410-N which sequentially sample the analog input signal as a pulse propagates through shift registers 220-1 to 220-N. AND gates 440-1 to 440-N trigger respective write circuits 120-1 to 120-N on the falling edge of the signal from shift registers 220-1 to 220-N while signal RECORD is asserted. De-multiplexers 430-1 to 430-N route the samples from sample-and-hold circuits 410-1 to 410-N to analog write circuits 120-1 to 120-N which write the samples to memory arrays 130-1 to 130-N.

During playback, control signal PLAYBACK is asserted; and control signal RECORD is deasserted. The falling edges of the signals from shift registers 220-1 to 220-N trigger analog read circuits 140-1 to 140-N when signal PLAYBACK is asserted. Multiplexers 420-1 to 420-N connect the output signals from analog read circuit 140-1 to 140-N to sample-hold-circuits 410-1 to 410-N. Sample-and-hold circuits 410 sample the last value read, that is after the pulse has cycled through shift registers 220-1 to 220-N. Demultiplexers 430-1 to 430-N select one of the sample-and-hold circuits 410-1 to 410-N which supplies the current analog voltage for the output signal.

Although the present invention has been described with reference to particular embodiments, the description is only an example of the invention's application and should not be taken as a limitation. Various adaptations and combinations of features of the embodiments disclosed are within the scope of the present invention as defined by the following claims.

We claim:

1. A non-volatile analog memory comprising:
a set of memory sections;
a set of recording pipelines coupled to the memory sections, wherein each recording pipeline includes an analog write circuit coupled to write an analog value in an associated one of the memory sections and is capable of performing a write operation while another of the recording pipelines writes an analog value to another one of the memory sections; and
means for sequentially initiating write operations by the recording pipelines, wherein a write operation for a first of the recording pipelines is initiated while a second of the recording pipelines is executing a previously initiated write operation.

2. The memory of claim 1, further comprising a series of playback pipelines coupled to the memory sections, wherein each playback pipeline is coupled to read an analog value from an associated one of the memory sections and is capable of executing a read operation while another of the playback pipelines is executing a read operation.

3. The memory of claim 2, further comprising means for sequentially initiating read operations, wherein a read operation is initiated for a first of the playback pipelines while a second of the pipelines is executing a read operation that was initiated previously.

4. The memory of claim 2, wherein during playback of a signal stored in the memory sections, the means for initiating write operations sequentially initiates read operations, wherein a read operation is initiate for a first of the playback pipelines while a second of the playback pipelines is executing a previously initiated read operation.

5. A non-volatile analog memory comprising:
a set of memory sections;
a set of recording pipelines coupled to the memory sections, wherein each recording pipeline is coupled to write an analog value to an associated one of the memory sections and performs a write operation independent of the other recording pipelines; and
timing circuit that comprises a series of shift registers, each shift register being associated with one of the recording pipelines, wherein the shift registers are connected in series so that a pulse propagates through the series of shift registers at a rate determined by a sampling frequency, and the pulse propagating through each shift register initiates a write operation by the recording pipeline associated with that shift register.

6. The memory of claim 5, wherein each recording pipeline comprises:
a sample-and-hold circuit; and
an analog write circuit.

7. The memory of claim 1, wherein each memory section comprises an independent array of non-volatile memory cells.

8. The memory of claim 1, wherein each memory section comprises a segment in a segmented array of non-volatile memory cells.

9. The memory of claim 1, wherein the memory comprises a Flash memory.

10. The memory of claim 1, wherein each memory section comprises a block of non-volatile memory cells which is erasable independent of the other sections.

11. A non-volatile analog memory comprising:
a set of memory sections;
a series of playback pipelines coupled to the memory sections, wherein each playback pipeline is coupled to read an analog value from an associated one of the analog memory sections and is capable of performing read operations which overlap read operations of the other playback pipelines; and a timing circuit which sequentially initiates read operations of the playback pipelines, wherein a first of the read operation is begun by a first of the pipelines before a second of the pipelines completes a read operation previously begun.

12. The memory of claim 11, wherein each playback pipeline comprises:

a sample-and-hold circuit; and an analog read circuit.

13. The memory of claim 11, wherein each memory section comprises an independent array of non-volatile memory cells.

14. The memory of claim 11, wherein each memory section comprises a segment in a segmented array of non-volatile memory cells.

15. The memory of claim 11, wherein the memory comprises a Flash memory.

16. The memory of claim 15, wherein each memory section comprises a block of non-volatile memory cells which is erasable independent of the other sections.

17. A memory module for a recording system, comprising:

an array of memory cells;

an analog write circuit coupled to write an analog value in a selectable memory cell in the array;

a sample-and-hold circuit coupled to sample an analog signal to be recorded and provide to the analog write circuit a sample to be written into the array; and a timing circuit which in response to an input timing signal from a preceding memory module in the recording system, triggers sampling by the sample-and-hold circuit and asserts a timing signal for input to a following memory module in the recording system.

18. The memory module of claim 17, wherein the timing circuit comprises a shift register having an input terminal for the input timing signal, a clock terminal for a signal at a sampling frequency, and an output terminal which provides the result of a shift operation as an input timing signal for the following memory module.

19. The memory module of claim 18, wherein the array, the analog write circuit, the sample-and-hold circuit, and the timing circuit are parts of a single monolithic integrated circuit.

20. A method for recording an analog signal in a non-volatile memory, the method comprising:

beginning to write a first analog value to a first memory array in a sequence of memory arrays; and beginning to write a second analog value to a second memory array in the sequence, wherein writing the second analog value begins after beginning to write the first analog value and before writing the first analog value is complete.

21. The method of claim 20, further comprising beginning to write a third analog value to a third memory array in the sequence, wherein writing the third analog value begins after beginning to write the second analog value and before writing the second analog value is complete.

22. The method of claim 21, wherein an interval between beginning to write the first analog value and beginning to write the second analog value is equal to an interval between beginning to write the second analog value and beginning to write the third analog value.

23. The method of claim 20, further comprising connecting a line carrying the analog signal to a sequence of write pipelines which are associated with the sequence of memory arrays.

24. The method of claim 23, further comprising:

sampling the analog signal to determine the first analog value; and sampling the analog signal to determine the second analog value.

25. A method for playing back an analog signal from a sequence of analog values stored in a sequence of sections of analog memory, the method comprising:

beginning to read a first of the analog values from a first of the memory sections; and beginning to read a second of the analog values from a second of the memory sections, wherein reading of the second analog value begins after beginning to read the first analog value and before reading of the first analog value is complete.

26. The method of claim 25, further comprising beginning to read a third analog value in the sequence, from a third of the memory arrays, wherein reading the third analog value begins after beginning to read the second analog value and before reading of the second analog value is complete.

27. The method of claim 26, wherein an interval between beginning to read the first analog value and beginning to read the second analog value is equal to an interval between beginning to read the second analog value and beginning to read the third analog value.

28. The method of claim 25, further comprising generating an output signal which after reading the first analog value is complete has a voltage level associated with the first analog value and after reading the second analog value is complete has a voltage level associated with the second analog value.

29. An analog memory module for a recording and then playing an analog signal, comprising:

an array of memory cells;

a first sample-and-hold circuit coupled to sample an analog signal to be recorded and hold an sample to be written into the array;

an analog write circuit coupled to write the sample from the first sample-and-hold circuit into a selectable memory cell in the array, wherein the analog write circuit begins writing in response to a signal which causes the first sample-and-hold circuit to hold the sample;

an analog read circuit coupled to read an analog value from a selectable memory cell in the array; and a second sample-and-hold circuit coupled to sample and hold the analog value read by the analog read circuit.

30. The analog memory of claim 29, wherein the second sample-and-hold circuit samples the analog value read in response to a signal which indicates the analog read circuit has completed a read operation.

* * * * *